SATURATED REACTOR REMOTE CONTROL TUNING

Filed June 25, 1956 2 Sheets-Sheet 1

INVENTOR.
Harold A. Wheeler
BY R. E. Fowler
ATTORNEY.

INVENTOR.
Harold A. Wheeler
BY R. E. Hoeder
ATTORNEY.

United States Patent Office 2,916,619

Patented Dec. 8, 1959

2,916,619

SATURATED REACTOR REMOTE CONTROL TUNING

Harold A. Wheeler, Great Neck, N.Y., assignor to General Motors Corporation, Detroit, Mich., a corporation of Delaware Application June 25, 1956, Serial No. 593,529

12 Claims. (Cl. 250—40)

This invention relates to oscillator control means and more particularly to remote tuning means for oscillatory circuits to vary the output frequency. Remote tuning means for various oscillatory circuits have in the past been rather complicated and costly or have been insufficiently stable when accurate operation is necessary.

It is therefore an object in making this invention to provide a remote tuning control for oscillatory or resonant circuits which is simple and stable and uses conventional elements.

It is a further object in making this invention to provide a remote control tuning means for oscillatory circuits utilizing a plurality of resonant circuits connected in series relation.

With these and other objects in view which will become apparent as the specification proceeds, my invention will be best understood by reference to the following specification and claims and the illustrations in the accompanying drawings, in which:

While my invention is capable of application to resonant circuits which are tuned in various manners, it is here illustrated as applied to circuits that are tuned by varying the inductance through a change in the magnetizing current for the core upon which the inductance is wound.

Figure 1:
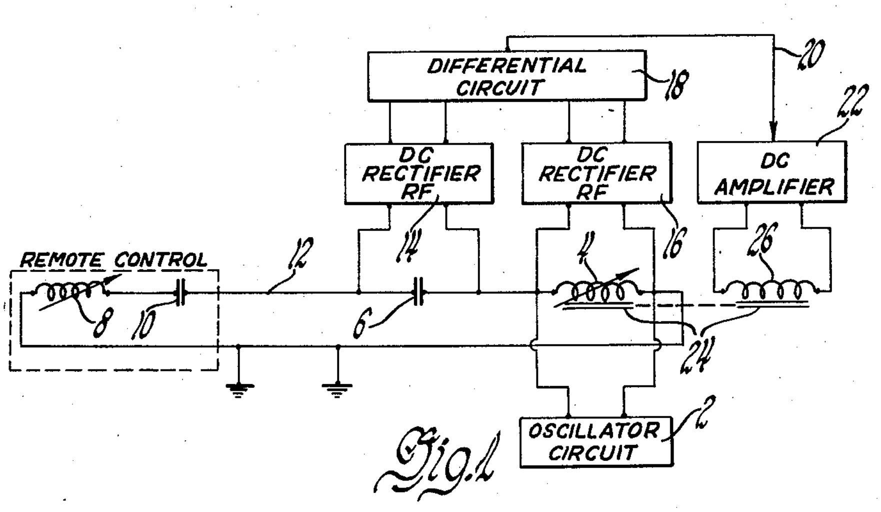
Figure 1 is a circuit diagram of a basic control circuit embodying my invention.

In Figure 1 oscillator 2 is the oscillator which it is desired to tune over a band of frequencies from a remote point. It is connected across an inductance 4 and the variation of the inductance 4 will tune the oscillator. Inductance 4 is connected directly in series with a condenser 6 to form a first resonant circuit. At some remote point from which control is to be exercised there is located a variable inductance 8 and a series connected condenser 10 which are shown within a dash line enclosure labeled "Remote Control." This forms a second resonant circuit. That section between the remote control and the oscillator and shown at 12 indicates a cable connection such for example as one of the coaxial type. From the basic connection it will be noted that the two resonant circuits consisting of inductance 8 and condenser 10 and inductance 4 and condenser 6 are connected in series relation. By changing the value of the inductance 8 it is desired to equally and simultaneously change the value of the inductance 4 to tune the oscillator. Such tuning is accomplished through the following means. Connected across the condenser 6 is a first rectifier 14. In like manner a second rectifier 16 is connected across the variable inductance 4. The output of each rectifier 14 and 16 is connected to the differential circuit 18 in which the D.C. voltages produced by each rectifier are connected in opposed relation. The output of the differential circuit 18 therefore will be a positive or a negative direct current voltage depending upon in which direction the unbalance of the two rectifiers occurred. The output of the differential circuit 18 is connected through line 20 to a D.C. amplifier 22. The series coupled inductance 4 is wound upon a core indicated at 24 and around which there is also wound a saturating winding 26. The fact that the core is common to inductance 4 and winding 26 is indicated by the dotted line extending between the two parts adjacent the coils 4 and 26. Each circuit 8—10 and 6—4 is series resonant and the two resonant circuits are mutually connected in series. The value of the inductance 4 determines the frequency of the oscillator 2. The variable inductance 8 may take any form in which the inductance may be varied. It may, for example, be a coil having a movable powdered iron core which is insertable therein to change the inductance value.

The operation of this system will now be described. When the oscillator is tuned to a desired frequency, inductance 4 and condenser 6 have equal reactance and therefore equal radio frequency voltages are developed across them. Since these radio frequency voltages are equal, rectifiers 14 and 16 connected across them will develop equal D.C. voltages. As described, the differential circuit connects these two D.C. voltages in opposition and the resultant output voltage on line 20 when the oscillator is tuned will be zero, and no operating voltage will be applied across magnetizing winding 26. Under these conditions the inductance 8 and condenser 10 likewise have equal reactance. If now it is desired to change the frequency at which the oscillator is running, the operator may vary the value of inductance 8 by moving the suggested iron core or in any other desired manner. This changes the balance of the remote resonant circuit consisting of inductance 8 and condenser 10, and causes a current flow through the mutual series circuit including the transmission line 12.

This changes the balance across inductance 4 and condenser 6 so that more or less D.C. voltage is supplied through rectifier 14 than through rectifier 16. The differential circuit 18 will now provide an output voltage on line 20 whose sign and value are dependent upon the direction and amount of movement of the tuning inductance. The D.C. voltage appearing on line 20 is amplified in D.C. amplifier 22 and is applied to the magnetizing winding 26 on the common core 24. This alters the magnetization of the core and in turn varies the value of inductance 4. This variation is in the direction to restore the equal reactance relationship between inductance 4 and condenser 6 and continues until the two reactances balance and the circuit is again in resonance. This rebalance appears at a value of inductance which provides the desired frequency for the oscillator 2. The manual means for adjusting inductance 8 may be calibrated in oscillator frequency if desired. The rebalance also restores the situation in which the resonant circuit 8—10 is once more series tuned to the same frequency as the resonant frequency 4—6 and both circuits have zero reactance. The use of this series remote circuit permits the use of a considerable length of cable 12 and still provides a stable relationship between the two circuits. This is due to the fact that the cable only introduces a small and stable amount of series inductance and its capacitance has a negligible effect because it is across a very low impedance of a series resonant circuit. This circuit therefore provides a very satisfactory remote tuning means for an oscillatory system.

Figure 2:
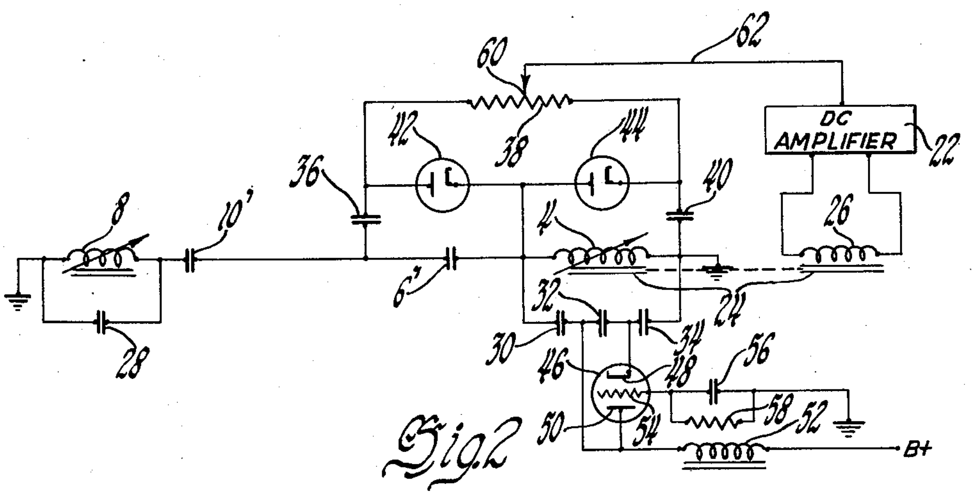
Figure 2 is a circuit diagram of a series parallel differential control circuit embodying my invention.

Figure 2 shows a modified form of my invention utilizing a parallel differnetial circuit. Instead of a single condenser used in the series tuned circuit, equal capacities are connected in series and in parallel with the inductances 8 and 4. In other words, the capacities of condensers 10′ and 28 are equal at the remote location and together with inductance 8 form a resonant circuit for tuning purposes. In like manner the capacity of condenser 6′ is equal to the combined capacities of condensers 30, 32 and 34 which are connected in a series circuit in shunt across inductance 4. A coupling condenser 36 connects one side of condenser 6′ to one terminal of resistor 38 and a similar coupling condenser 40 connects the other terminal of the resistance 38 to ground and to one side of inductance 4. A pair of rectifiers 42 and 44 are connected in series across the resistance 38 and a point between the two rectifiers is connected directly to an intermediate point between the condenser 6′ and the inductance 4. The oscillator tube 46 has its cathode 48 connected between condensers 32 and 34 and its plate 50 connected to a point intermediate condensers 30 and 32 and also through choke 52 to the B+ power supply. The control grid 54 of this tube is connected through a condenser 56 and grid leak resistor 58 to ground.

As in Figure 1, a variation in the inductance 4 will tune the oscillator through a given frequency band. Inductance 4 is again commonly wound on a core 24 with a saturating winding 26. A variable tap 60, movable over the surface of resistor 38 and connected through line 62 to the D.C. amplifier 22, now supplies the differential D.C. voltage to the amplifier for correction or variation of the inductance 4. The operation of the system is exactly the same as that in Figure 1 wherein manual adjustment of the inductance 8 provides variation of the remotely positioned oscillator inductance 4 to tune the oscillator. However, the dividing of the capacity into two halves, as previously described, assures that the operation shall be at the fundamental frequency of oscillation and insures against operation at harmonics. This is due to the fact that the other half of the capacity is in shunt with the inductance and therefore reduces the possibility of excessive harmonic content in the voltage applied to the rectifiers. This, therefore, assures that the rectifiers will act alike and will not be sensitive to unbalance by difference in harmonic content.

Figure 3:
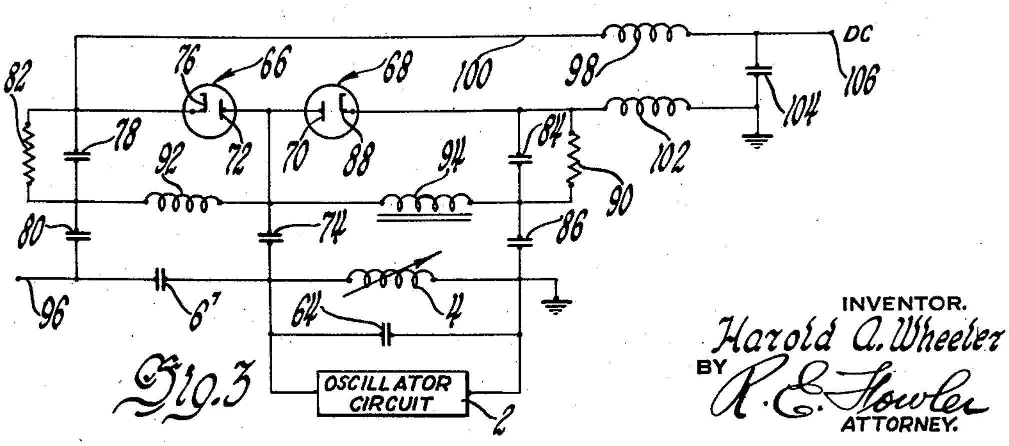
Figure 3 is a circuit diagram of a modified form of a control circuit shown in Figure 2 utilizing a series differential circuit.

Figure 3 shows only that portion of the system associated with the local oscillator inductance 4 and the series condenser 6′, and is a modified form of Figure 2. In this case the shunt capacitance across inductance 4 is indicated at 64 and the two rectifiers 66 and 68 are connected in opposed relation. The plates 70 and 72 are connected through condenser 74 to a point intermediate condenser 6′ and inductance 4. Cathode 76 of rectifier 66 is connected to one terminal of a condenser 78 which is in turn connected through condenser 80 to one terminal of condenser 6′. A shunting resistance 82 is connected around condenser 78. A similar balanced circuit is provided by condenser 84 connected in series with the condenser 86 between cathode 88 of rectifier 68 and ground. A resistor 90 is connected in shunt across condenser 84. An inductance coil 92 is connected between one terminal of condenser 74 and a point intermediate condensers 78 and 80 and the second inductance coil 94 is connected between the same terminal of condenser 74 and an intermediate point between condensers 84 and 86. The oscillator 2 is connected across the tuning inductance 4 as in the previous instances and the cable 12 is connected to contact 96. A further filter connected directly across the rectifiers 66 and 68 consists of an inductance 98 connected to one end of the rectifier 66 through line 100 and a second inductance 102 connected between rectifier 68 and ground. A condenser 104 is conected across the inductances 98 and 102 and the D.C. output is taken off terminal 106. While this circuit is much more complicated than Figure 2, it is provided to assure identical operation of the pair of rectifiers and to provide in the D.C. output the filtered accurate resultant. The chokes and coupling capacitors have little effect on the tuned circuit but do provide for identical operation of the two halves. Otherwise the system operates in the same manner as Figure 2.

Figure 4:
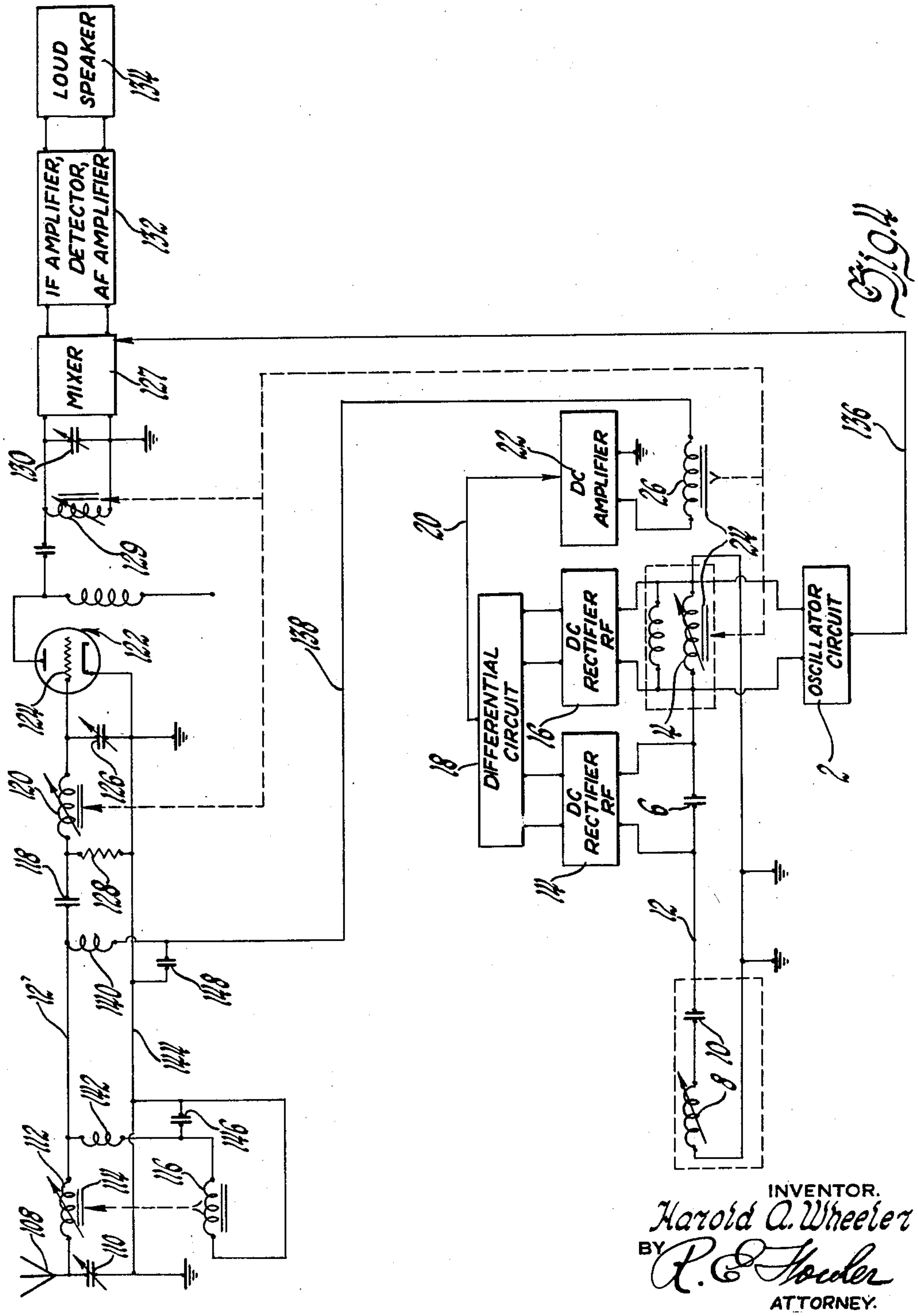
Figure 4 is a block and circuit diagram of my control circuit as applied to a multi stage radio receiver.

While the use of the remote control has been described as suitable for tuning only an oscillator over a certain frequency band, it can also be utilized to tune a complete radio receiver by applying additional tuning circuits. In Figure 4 that portion shown in the lower part is the local oscillator which is tuned by remote control as indicated in Figures 1 through 3. The upper portion of the circuit diagram schematically represents the skeleton outline of a conventional radio receiver. The remote control unit again utilizes a manually variable inductance 8 with its associated condenser 10 connected through cable 12 with the condenser 6 and variable inductance 4. The local oscillator 2 is connected across the variable inductance 4. Again, the variable inductance 4 is mounted on a saturable core 26, which core is utilized as a mounting for various tuning inductances used in the set. The magnetizing winding 26 is likewise mounted on this core and various other windings are also. The common core is indicated by the dashed line interconnecting the spaced portions together with the arrows.

The radio receiver includes an antenna 108 connected to ground through an adjustable condenser 110. A further adjustable inductance 112 connected between the antenna and the first stage of the radio frequency amplifier completes the tuning means for the antenna circuit. The inductance 112 is mounted on a saturable core 114, the saturation of which may be changed by a magnetizing coil 116 mounted on the same core and fed by saturating current from a circuit to be described. This antenna unit may be a remote unit as indicated by the interconnecting cable 12′ which connects the antenna section with the remainder of the receiver. Thus the antenna, together with a tunable resonant circuit, may be mounted at such remote point as on the roof of the automobile or in the rear quarter.

A coupling condenser 118 is connected between the cable 12′ and the tunable inductance coil 120 for the radio frequency amplifying tube 122. The opposite terminal of the inductance 120 is connected directly to the control grid 124 of the tube 122. An adjustable condenser 126 completes a resonant circuit for this RF stage. A resistance 128 is connected between ground and a point intermediate condenser 118 and inductance 120 to act with said condenser as a filter. The output of the RF stage is connected directly to the input of the mixer stage 127 through a resonant circuit consisting of a variable inductance 129 and an adjustable condenser 130. As is conventional, the output of the mixer is amplified in an IF amplifier, detected in a detector, and further amplified in an AF amplifier, all represented by the box 132. The output of the AF amplifier is fed directly to a loud speaker 134 where it issues as intelligible sound. Both the RF amplified signal and the oscillator output are fed into the mixer stage. The connection between the oscillator and the mixer is indicated by line 136.

As previously mentioned, the saturating winding 26 is wound on the core 24 which acts as a common core for inductance 4 in the oscillator circuit, inductance 129 in the RF amplifier, and inductance 120 in the tuned circuit in the input to the RF amplifier stage. Thus any change in the current through the saturating winding will cause a variation in all of these inductances due to a change in saturation in the common core. In Figure 4 the inductance 4 is tuned by the remote tuning means through the same circuit as completely described with reference to Figure 1 which includes the rectifiers 14 and 16 connected respectively across condenser 6 and inductance 4. The output from the two rectifiers feeds into a differential circuit 18 in opposed relation to produce any unbalanced corrective voltage as a D.C. voltage on line 20 which voltage is amplified in D.C. amplifier 22 and applied to the saturating winding 26. Thus as the operator varies the value of the inductance 8 at a remote point manually, the value of inductance 4 controlling the oscillator circuit will vary proportionally and simultaneously the value of the RF inductances 120 and 129 will be varied to tune the receiver to a new desired frequency except the antenna circuit, which must also be tuned.

It was previously mentioned that it may be desirable to locate the antenna at a remote point from the receiver, such for example as on the roof or perhaps in the rear quarter. It is also necessary to tune the resonance antenna circuit at the same time as the RF circuits by the remote tuning means. This is accomplished by connecting one terminal of the D.C. amplifier 22 to ground and the high voltage terminal through saturating inductance 26, line 138, and a choke coil 140 to one line of the cable 12'. This line is similarly connected at the remote antenna unit through choke 142 to the saturating winding 116 on core 114 and thence back through the opposite line 144 of the cable 12' to ground. A high frequency shunt consisting of condenser 146 is connected across the saturating inductance 116 and also a second condenser 148 between line 138 and ground to keep the high frequency and the D.C. separated. By this means any change in flow through the saturating winding 26 to change the saturation of the common core 24 and associated tuning of the inductances 4, 120 and 129 will also result in a similar change in current flow through the saturating winding 116 at the remote antenna unit to cause a similar change in saturation of the core 114 to tune the antenna inductance 112 and therefore the antenna resonant circuit.

I have therefore provided by my novel apparatus simple remote control means for tuning oscillatory apparatus or a complete radio receiver.

I claim:

1. In electrical apparatus, a first resonant circuit including two impedances, an oscillatory circuit including a source of electrical power and a second resonant circuit having two impedances, the second resonant circuit being tuned to the resonant frequency of the first circuit and being located remotely from the first resonant circuit, said first and said second resonant circuits being connected together in series relation so that current may commonly flow therethrough, means for varying at least one impedance of the first resonant circuit and changing the current flow through both resonant circuits, and balancing means connected to the second resonant circuit and operable in response to the variation of the impedance in the first resonant circuit and current flow to vary an impedance in the second resonant circuit automatically to maintain the resonant frequency of the second resonant circuit the same as the resonant frequency of the first resonant circuit.

2. In electrical apparatus, a first resonant circuit including inductance and capacitance, an oscillatory circuit including a source of electrical power and a second resonant circuit having inductance and capacitance and located remotely from the first, said first and second resonant circuits being connected in series so that common current may flow therethrough, means for manually varying the inductance of the first resonant circuit and balancing means connected to the second resonant circuit to vary the inductance in the second resonant circuit automatically to maintain the resonant frequency of the second circuit the same as the resonant frequency of the first.

3. In electrical apparatus, a first resonant circuit including an inductance and capacitance in series relation, an oscillatory circuit including a source of electrical power and a second resonant circuit having a second inductance and capacitance in series relation, conductive means connecting said first and second resonant circuits in series, means for adjusting the value of one of the components of the first resonant circuit to tune the same to a different resonant frequency and balancing means connected across the second resonant circuit to vary the value of the corresponding component in the second resonant circuit to automatically tune the second circuit to the same resonant frequency as the first.

4. In electrical apparatus, a first series resonant circuit formed of two reactance components, one of which is variable, an oscillatory circuit including a source of electrical power and a second series resonant circuit formed of two reactance components, one of which is variable, said second resonant circuit being connected in series with the first, a plurality of rectifier means each individually connected across one of the reactance components of the second resonant circuit, the output circuits of said rectifier means being connected in opposed voltage relation so that if the circuit is at resonance the resultant voltage is zero, and means connected to the output circuits to vary the variable reactance component in the second series resonant circuit if the resultant voltage varies from zero in either direction.

5. In electrical apparatus, a first resonant circuit including a variable inductance and a capacitance in series, an oscillatory circuit including a source of electrical power and a second resonant circuit having a variable inductance and a capacitance in series connected in series relation with the first resonant circuit, rectifier means connected across the variable inductance and rectifier means connected across the capacitance of the second resonant circuit, means connected across both rectifier means so that the developed voltages oppose in polarity and means connected to the last-named means to vary the value of the second resonant circuit inductance if the opposed voltages do not balance.

6. In electrical apparatus, a first resonant circuit including a variable inductance and a capacitance in series, an oscillatory circuit including a source of electrical power and a second resonant circuit having a variable inductance and a capacitance in series connected in series relation with the first resonant circuit, a plurality of rectifiers one connected across the inductance and one across the capacitance of the second resonant circuit, said rectifiers having a common output circuit in which the developed voltages are of opposite sign so that if the voltages across the inductance and capacitance are equal there will be no resultant voltage, direct current amplifying maens connected to the output circuit, and means connected to the direct current amplifier to vary the inductance of the second resonant circuit when a resultant voltage appears.

7. In electrical apparatus, a first resonant circuit including a variable inductance and a capacitance in series, an oscillatory circuit including a source of electrical power and a second resonant circuit having a variable inductance and a capacitance in series connected in series relation with the first resonant circuit, a plurality of rectifiers each individually connected across the inductance and the capacitance of the second resonant circuit and having a common output circuit in which the developed voltages are of opposite sign so that if the voltages across the inductance and capacitance are equal, there will be no resultant voltage, direct current amplifying means connected to the output circuit, and magnetizing coil means connected to the output of the direct current amplifier and mounted adjacent the inductance in the second resonant circuit to vary the value of the inductance when a resultant voltage appears in the output circuit of the rectifiers.

8. In electrical apparatus, a first resonant circuit including a variable inductance and a capacitance in series, an oscillatory circuit including a source of electrical power and a second resonant circuit having a variable inductance and a capacitance in series connected in series relation with the first resonant circuit, first rectifier means connected across the variable inductance of said second resonant circuit, second rectifier means connected across the capacitance of the second resonant circuit, said first and second rectifier means being connected together in opposed relation, magnetizable core means upon which the variable inductance of the second resonant circuit is mounted and a saturating winding mounted on said core and connected to the output of the first and second rectifier means to vary the inductance as the rectifier output changes.

9. In electrical apparatus, a first resonant circuit including inductance and capacitance, one of which is variable, and oscillatory circuit including a source of electrical power and a second resonant circuit said second resonant circuit being connected in series relation with said first resonant circuit and including inductance and capacitance, one of which is variable, a first rectifier connected across the inductance of the second resonant circuit, a second rectifier connected across the capacitance of the second resonant circuit, condensers connected between the rectifiers and the capacitance and inductance, a differential circuit connected across the rectifiers and operable means connected to said differential circuit and to the variable reactance in the second resonant circuit to vary the same with a variation in rectifier output.

10. In electrical apparatus, a first resonant circuit including inductance and capacitance, one of which is variable, an oscillatory circuit including a source of electrical power and a second resonant circuit said second resonant circuit being connected in series relation with said first resonant circuit and including inductance and capacitance, one of which is variable, a first rectifier connected across the inductance of the second resonant circuit, a second rectifier connected across the capacitance of the second resonant circuit, condensers connected between the rectifiers and the capacitance and inductance, inductance means connected across the rectifiers to assure balanced operation, filtering means connected to the combined rectifier output, and means connected to said filtering means to vary the value of the reactance in the second resonant circuit that is variable.

11. In radio receiving apparatus, a plurality of tunable circuits including inductance and capacitance, an oscillatory circuit including a source of electrical power and one of the tunable circuits, means for commonly mounting the inductances on a core, a remote tunable circuit including a variable inductance and capacitance, conductive means connecting said remote tunable circuit and one of the first-named tunable circuits in series relation, balanced opposed rectifier means connected individually across the inductance and the capacitance connected in series with the remote tunable circuit, and saturating winding means mounted on said common core and connected to the balanced opposed rectifier means to vary the saturation and simultaneously change the value of all of the inductances to tune the radio apparatus when the rectifier output is unbalanced by the adjustment of the remote variable inductance.

12. In radio receiving apparatus, a plurality of tunable circuits including inductance and capacitance, an oscillatory circuit including a source of electrical power and one of the tunable circuits, means for commonly mounting the inductances on a core, a remote tunable circuit including a variable inductance and capacitance, conductive means connecting said remote tunable circuit and one of the first-named tunable circuits in series relation, balanced opposed rectifier means connected individually across the inductance and the capacitance connected in series with the remote tunable circuit, saturating winding means mounted on said common core and connected to the balanced opposed rectifier means to vary the saturation and simultaneously change the value of all of the inductances to tune the radio apparatus when the rectifier output is unbalanced by the adjustment of the remote variable inductance, a second remote tunable circuit including inductance and capacitance, core means for said last-named inductance, a second saturating winding mounted on said remote core means and means for connecting said second saturating winding in series with the first and subject to the same control voltages so that both local and remote tunable circuits will be simultaneously tuned by variation of the first remote inductance.

References Cited in the file of this patent

UNITED STATES PATENTS

| | | |
|---|---|---|
| 2,190,319 | Koch | Feb. 13, 1940 |
| 2,415,469 | Webb | Feb. 11, 1947 |
| 2,490,591 | Himmer | Dec. 6, 1949 |